(12) United States Patent
Lin et al.

(10) Patent No.: US 9,383,789 B2
(45) Date of Patent: Jul. 5, 2016

(54) THERMAL CONTROL APPARATUS AND METHODOLOGY

(75) Inventors: Jim J. Lin, Saratoga, CA (US); Kiran B. Kattel, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 13/529,202

(22) Filed: Jun. 21, 2012

(65) Prior Publication Data

US 2013/0345892 A1    Dec. 26, 2013

(51) Int. Cl.
| | |
|---|---|
| G05D 23/00 | (2006.01) |
| G05D 17/00 | (2006.01) |
| G05D 9/00 | (2006.01) |
| G05D 5/00 | (2006.01) |
| G05D 3/00 | (2006.01) |
| H01L 35/00 | (2006.01) |
| H01L 37/00 | (2006.01) |
| G01K 1/00 | (2006.01) |
| G01K 5/00 | (2006.01) |
| G01K 3/00 | (2006.01) |
| G06F 1/00 | (2006.01) |
| H03K 3/42 | (2006.01) |
| H03K 17/78 | (2006.01) |
| G06F 1/20 | (2006.01) |
| H03K 19/003 | (2006.01) |
| G06F 1/32 | (2006.01) |

(52) U.S. Cl.
CPC .......... *G06F 1/206* (2013.01); *H03K 19/00369* (2013.01); *G06F 1/324* (2013.01); *G06F 1/3296* (2013.01); *Y02B 60/1217* (2013.01)

(58) Field of Classification Search
USPC ........................................................ 700/299
See application file for complete search history.

(56) References Cited

U.S. PATENT DOCUMENTS

| | | | |
|---|---|---|---|
| 5,451,892 A | 9/1995 | Bailey | |
| 5,940,786 A | 8/1999 | Steeby | |

(Continued)

FOREIGN PATENT DOCUMENTS

| | | |
|---|---|---|
| CN | 1622046 | 6/2005 |
| DE | 19531706 | 3/1997 |

(Continued)

OTHER PUBLICATIONS

Partial European Search Report in Application No. 13171669.8 dated Dec. 10, 2013, pp. 1-6.

(Continued)

*Primary Examiner* — Mohammad Ali
*Assistant Examiner* — Md Azad
(74) *Attorney, Agent, or Firm* — Meyertons, Hood, Kivlin, Kowert & Goetzel, P.C.; Erik A. Heter

(57) ABSTRACT

Various embodiments of a thermal control methodology and apparatus are disclosed. In one embodiment, an integrated circuit includes one or more thermal sensors, comparison circuitry, and control circuitry. The comparison circuitry is configured to receive temperature readings from the one or more thermal sensors. The control circuitry is configured to reduce a performance level of one or more controlled subsystems responsive to the comparison circuitry determining that at least one temperature reading from the one or more thermal sensors exceeds one of one or more threshold values. A software-based thermal control mechanism may also execute concurrently with the apparatus.

22 Claims, 5 Drawing Sheets

(56) References Cited

U.S. PATENT DOCUMENTS

| | | | |
|---|---|---|---|
| 6,442,700 B1 | 8/2002 | Cooper | |
| 7,149,645 B2 | 12/2006 | Mangrulkar et al. | |
| 7,386,737 B2 | 6/2008 | Finkelstein | |
| 7,451,332 B2 | 11/2008 | Culbert et al. | |
| 7,454,640 B1 | 11/2008 | Wong | |
| 7,565,258 B2 | 7/2009 | Duarte | |
| 7,613,002 B2 | 11/2009 | Ye | |
| 7,690,843 B2 | 4/2010 | Bowden et al. | |
| 7,878,016 B2 | 2/2011 | Rotem et al. | |
| 8,136,366 B2 | 3/2012 | Li | |
| 2004/0159904 A1 | 8/2004 | Clabes et al. | |
| 2004/0204899 A1 | 10/2004 | Gunther et al. | |
| 2005/0217290 A1 | 10/2005 | Watakabe et al. | |
| 2007/0124104 A1* | 5/2007 | Johns et al. | 702/130 |
| 2008/0022140 A1 | 1/2008 | Yamada et al. | |
| 2009/0292404 A1 | 11/2009 | Adachi et al. | |
| 2010/0073068 A1* | 3/2010 | Cho et al. | 327/513 |
| 2010/0094582 A1 | 4/2010 | Cox et al. | |
| 2010/0117579 A1 | 5/2010 | Culbert et al. | |
| 2011/0063937 A1 | 3/2011 | Eid et al. | |
| 2011/0194223 A1 | 8/2011 | Kang et al. | |
| 2011/0301777 A1 | 12/2011 | Cox et al. | |
| 2011/0301778 A1 | 12/2011 | Liang et al. | |
| 2013/0184895 A1 | 7/2013 | Wen | |

FOREIGN PATENT DOCUMENTS

| | | |
|---|---|---|
| JP | 2005293364 | 10/2005 |
| JP | 2007109085 | 4/2007 |
| JP | 2008026948 | 2/2008 |
| KR | 1020040008948 | 2/2004 |
| KR | 1020050080822 | 8/2005 |
| WO | 2012058202 | 5/2012 |

OTHER PUBLICATIONS

Office Action from Japanese Application No. 2013-130450, mailed Jun. 16, 2014, English and Japanese versions, pp. 1-12.
Notice of Allowance from Japanese Application No. 2013130450, issued Oct. 14, 2014, English and Japanese versions, pp. 1-10.
Extended European Search Report for Application No. 13171669.8-1810 / 2685632, mailed Apr. 17, 2014, Apple Inc., pp. 1-12.
International Search Report and Written Opinion for corresponding International Application No. PCT/US2013/040740, Sep. 19, 2013, pp. 1-8.
Communication pursuant to Article 94(3) EPC in European Patent Application 13171669.8 mailed Mar. 26, 2015.
Office Action from Taiwanese Application No. 102119202, issued Dec. 8, 2014, English and Chinese versions, pp. 1-27.
International Preliminary Report on Patentability from PCT/US2013/040740, issued Dec. 31, 2014, Apple Inc., pp. 1-7.
Office Action in China Application No. 201310245720.X issued Jan. 18, 2016.
Decision of the IPO in Taiwan application No. 102119202 issued Apr. 30, 2015.
Notice of Allowance, Korean Application No. 10-2013-71805, mailed May 20, 2015, 3 pages.

* cited by examiner

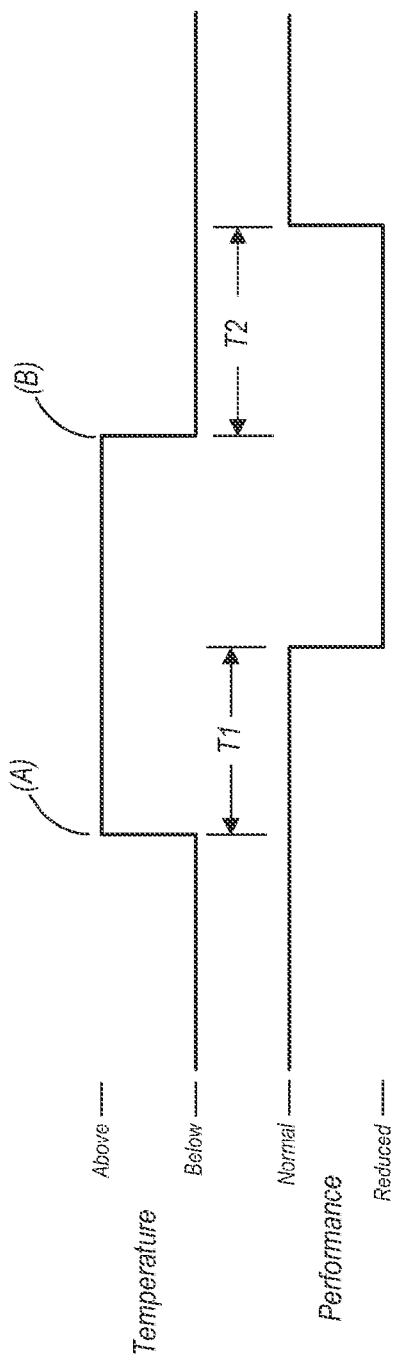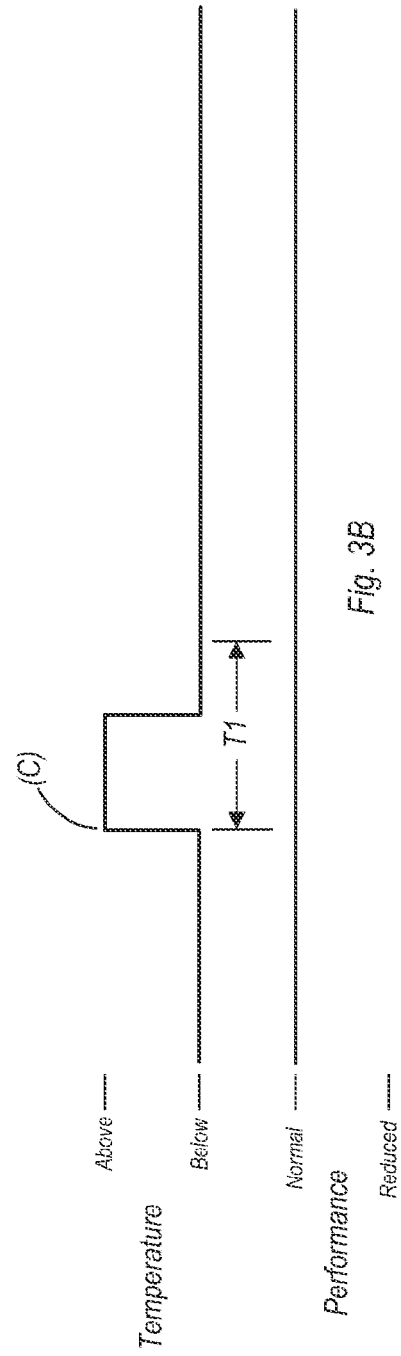

THERMAL CONTROL APPARATUS AND METHODOLOGY

BACKGROUND

1. Field of the Invention

This disclosure is related to electronic systems, and more particularly, to the thermal control of electronic systems.

2. Description of the Related Art

As the number of transistors implemented integrated circuits (ICs) has increased, the management of issues related to temperature has increased in importance. In many ICs, a large number of transistors operating at the same time can produce a significant amount of heat. If left unchecked, the amount of heat generated by the operation of the transistors of an IC may cause erroneous operation or permanent damage.

Temperature sensors are implemented on many different types of ICs. One or more temperature sensors may be place on an IC die and may be used to determine a temperature at a respective location thereon. The temperature sensors may measure and report temperature information to other circuitry, such as one or more registers. In some IC's, such as various types of processors and systems on a chip (SOCs), software may be executed that monitors the registers. If a temperature exceeding a predefined threshold is detected, the software may initiate actions to shut down one or more portions of the IC.

SUMMARY

Various embodiments of a thermal control methodology and apparatus are disclosed. In one embodiment, an integrated circuit includes one or more thermal sensors, comparison circuitry, and control circuitry. The comparison circuitry is configured to receive temperature readings from the one or more thermal sensors. The control circuitry is configured to reduce a performance level of one or more controlled subsystems responsive to the comparison circuitry determining that at least one temperature reading from the one or more thermal sensors exceeds one of one or more threshold values.

In one embodiment, the comparison circuitry and the control circuitry may operate in parallel with a software temperature control routine executed on a processor. Thus, the system may include both hardware and software thermal monitoring and control mechanisms. The hardware mechanism (including, e.g., comparison circuitry) may monitor temperature readings received from the one or more temperature sensors more frequently than the software mechanism. If the hardware mechanism determines that a temperature reading exceeds a temperature threshold, then the hardware mechanism may cause a corresponding reduction to a performance level to at least a corresponding functional unit of the IC. This reduction in the performance level may allow the temperature at the reporting sensor to fall back below the temperature threshold prior to being checked by the software mechanism.

In one embodiment, multiple temperature thresholds may be used. For example, the control circuit may reduce the performance of a controlled subsystem by a first amount responsive to determining that a corresponding temperature value has exceeded a first threshold, or by a second amount responsive to determining that the corresponding temperature value has exceeded a second threshold. The second threshold may be greater than the first threshold. The software mechanism may shut down the controlled subsystem (as well as other portions of the integrated circuit, in some embodiments) if a corresponding temperature reading exceeds the second threshold. In some embodiments, the software mechanism may take no action upon determining that a temperature reading exceeds the first threshold. Thus, the hardware mechanism may be allowed an opportunity to maintain the temperature of various subsystems of the integrated circuit within safe limits without having to perform a complete shutdown. The software mechanism may perform a shutdown of one or more controlled subsystems only after the hardware mechanism is no longer able to maintain respective temperatures within safe limits.

Various types of performance reductions may be performed by the control circuitry in different embodiments of the hardware mechanism. For example, the frequency of a clock signal provided to a controlled subsystem may be reduced responsive to a temperature reading exceeding a threshold in one embodiment. Other types of performance reductions may include operating voltage reductions, bandwidth limitations, re-allocation of a workload to another subsystem (e.g., from one processor core to another) and so forth.

BRIEF DESCRIPTION OF THE DRAWINGS

The following detailed description makes reference to the accompanying drawings, which are now briefly described.

FIGS. 3A and 3B are timing diagram illustrating hysteresis in the operation of one embodiment of a hardware-based thermal control apparatus.

Figure 1:
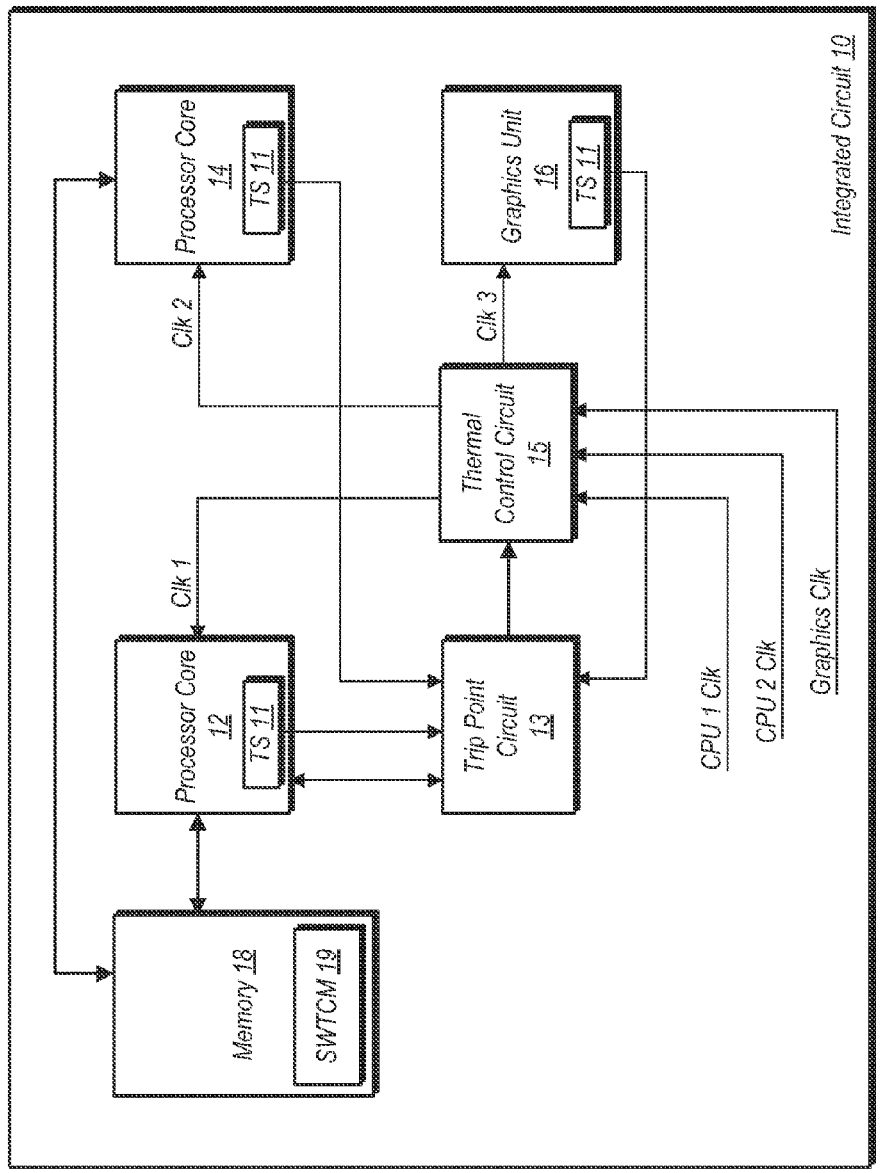
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) is shown. In the embodiment shown, IC 10 is a system-on-a-chip (SoC) including processor cores 12 and 14, a graphics unit 16, and an on-chip memory 18. Memory 18 in the embodiment shown may be a read-only memory (ROM), a flash memory, a random access memory, or any other suitable memory type. IC 10 also includes various thermal control mechanisms to monitor and regulate its temperature during operation. In this example, processor cores 12 and 14 and graphics unit 16 each include a temperature sensor 11. Each of the temperature sensors 11 is coupled to trip point circuit 13, which is configured to compare temperatures readings received from each of the thermal sensors to one or more threshold values. IC 10 also includes a thermal control circuit 15 that is coupled to receive comparison information from trip point circuit 13. In this particular embodiment, thermal control circuit 15 may adjust performance levels of the various functional units (or subsystems) of IC 10 by changing the frequencies of respectively received clock signals. Embodiments are also possible and contemplated in which thermal control circuit 15 may perform other control actions to adjust respective performance levels. Such action may include, but are not limited to, voltage adjustments, bandwidth adjustments, workload allocation/re-allocation, and so on.

Trip point circuit 13 and thermal control circuit 15 may comprise a hardware-based thermal control mechanism. That is, the hardware-based thermal control mechanism in the embodiment shown is implemented using hardware circuits of IC 10. IC 10 in this embodiment is also configured to implement a software-based thermal control mechanism that may run in parallel with, and complementary to, the hardware-based thermal control mechanism. More particularly, instructions for implementing software-based thermal control mechanism (SWTCM) 19 are stored in memory 18 in this embodiment. The instructions of SWTCM 19 may be accessed by processor core 12, which may execute the instructions to carry out a software-based thermal control routine. During execution of instructions of SWTCM 19, processor core 12 may access temperature comparison results from trip point circuit 13, and may take thermal control actions based thereupon.

As noted above, trip point circuit 13 may compare received temperature readings to one or more temperature thresholds. These thresholds may be programmable, or may be hardwired into trip point circuit 13. In either case, reporting of the comparison results to thermal control circuit 15 may be performed at pre-defined intervals. Concurrent with operation of the hardware-based thermal control mechanism, instructions of SWTCM 19 executed by processor 12 may access comparison results from trip point circuit 13 at its own pre-defined intervals. In the embodiment shown, the intervals at which trip point circuit 13 reports comparison results to thermal control circuit 15 may be shorter in duration than the intervals at which SWTCM 19 accesses comparison information from trip point circuit 13. Thus, thermal control circuit 15 may receive updated comparison information more frequently than comparison information is received by instructions of SWTCM 19 executed by processor core 12.

Thermal control circuit 15 in the embodiment shown is coupled to receive three different clock signals, CPU 1 Clk, CPU 2 Clk, and Graphics Clock. Corresponding output clock signals Clk 1, Clk 2, and Clk 3, are provided from thermal control unit 15 to processor core 12, processor core 14, and graphics unit 16, respectively. The input clock signals may essentially serve as full frequency reference clock signals for their corresponding output clock signals. Thermal control circuit 15 in this particular embodiment may reduce the performance of any of processor cores 12 and 14 and graphics unit 16 by dividing the input clock signals to produce respective output clock signals at a reduced frequency. In this embodiment, the clock signals may be divided independently of one another such that some units may operate in a reduced performance mode while others may operate in a full (normal) performance mode.

Since the hardware-based thermal control mechanism updates at more frequent intervals than the software-based thermal control mechanism, the hardware-based mechanism may provide finer grain thermal control functionality for IC 10. Accordingly, as noted above, the hardware-based thermal control mechanism may perform various types of performance adjustments to IC 10 responsive to certain comparison results. For example, if a temperature reading exceeds a first temperature threshold, thermal control circuit 15 may reduce, by a first amount, the performance of a functional unit associated with the reporting temperature sensor 11. If the temperature reading exceeds a second temperature threshold, thermal control circuit may reduce, by a second amount, the performance of the functional unit associated with the reporting temperature sensor. Using the example of a clock frequency, thermal control circuit 15 may reduce the frequency of a corresponding clock signal by a first amount if the first temperature threshold is exceeded, and may reduce the frequency of the corresponding clock signal by a second amount if the second temperature threshold is exceeded. In this particular example, the thermal control action was performed with respect to only the functional unit associated with the reporting temperature sensor. However, embodiments are possible and contemplated wherein performance reductions may be performed to additional functional units responsive to a temperature reading exceeding one of the thresholds. It is further noted that, responsive to a temperature reading falling below one of the threshold values, performance may be restored to values from which they were previously reduced.

The hardware thermal control mechanism may include hysteresis in its operation. Thermal control circuit 15 may not immediately reduce the performance level of one or more of the functional units responsive to an initial indication of a temperature reading from a particular temperature sensor 11 exceeding a threshold. Instead, thermal control circuit 15 may wait for a predetermined time. If, after the predetermined time has elapsed, the temperature reading from the particular temperature sensor 11 is still above the threshold, thermal control circuit 15 may perform a thermal control action, such as a reduction of clock frequency to at least the corresponding functional unit. If, on the other hand, the temperature reading from the particular temperature sensor 11 falls back below the threshold voltage before the predetermined time has elapsed, thermal control circuit 15 may maintain the performance level of the corresponding functional unit at its current level.

Hysteresis may also be used in boosting performance levels when a temperature falls below a temperature threshold. In the embodiment shown, thermal control unit 15 may wait another predetermined time to boost the performance of a functional unit after a corresponding temperature reading has fallen below a given threshold. If the predetermined time elapses, and the temperature remains below the threshold, thermal control circuit 15 may boost the performance of a corresponding functional unit by, e.g., increasing its clock frequency. On the other hand, if the temperature does not remain below the threshold for the duration of the predetermined time, thermal control unit 15 may maintain the corresponding functional unit at a reduced performance level. It is noted that the predetermined times required for increasing the performance (when a temperature falls below a threshold) and reducing the performance (when a temperature is above the threshold) may be different from one another. Furthermore, these predetermined times may be programmable.

As previously noted, when its corresponding instructions are executed on processor core 12, SWTCM 19 may access temperature comparison results at intervals that are less frequent than the hardware-based thermal control mechanism. Moreover, SWTCM 19 may take different actions responsive to temperature readings exceeding a threshold. In this particular embodiment, responsive to a temperature reading from a particular temperature sensor 11 exceeding a maximum temperature threshold, processor core 12 may execute instructions for SWTCM 19 to shut down at least the corresponding functional unit. Typically, since the hardware-based thermal control mechanism updates more frequently, it may often times be able to maintain temperatures within prescribed limits. A determination by SWTCM 19 that a temperature exceeds a maximum threshold may indicate that the hardware-based thermal control mechanism has been unsuccessful in maintaining the temperature within prescribed limits, and thus a shutdown may be performed to prevent potential damage to circuitry of IC 10. The extent of the shutdown may vary based on the particular circumstances. For example, if a thermal sensor associated with only one functional unit is reporting a temperature greater than the maximum threshold, then only that functional unit may be shutdown. In another example, if thermal sensors associated with a number of functional units are reporting temperatures exceeding a maximum threshold, the entirety of IC 10 may be shut down. It is also noted that if processor core 12 is to be shut down in the embodiment shown, processor core 14 may assume the role of executing instructions for SWTCM 19.

In addition to a maximum temperature threshold, trip point circuit may compare received temperature readings to other threshold values. By implementing additional threshold values that are below the maximum value, the thermal output (and thus the temperature) of IC 10 and its respective functional units may be maintained within limits while potentially preventing shutdowns by the SWTCM 19.

Figure 2:
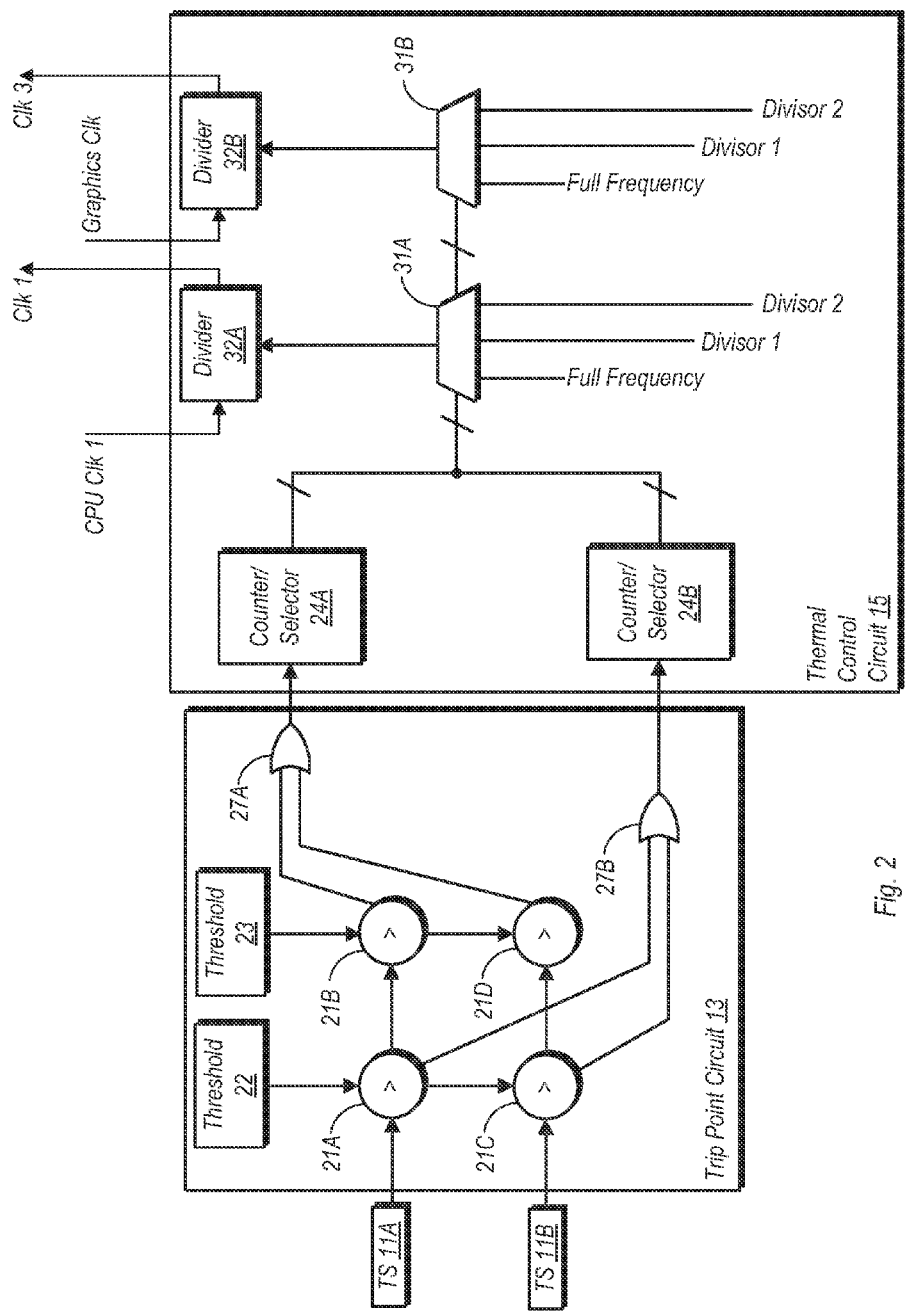
FIG. 2 is a block diagram of one embodiment of a hardware-based thermal control apparatus.

Turning now to FIG. 2, a block diagram of one embodiment of a hardware-based Thermal control apparatus is shown. More particularly, FIG. 2 illustrates details for one embodiment of each of trip point circuit 13 and thermal control circuit 15. In this exemplary embodiment, the hardware-based thermal control apparatus is configured to monitor two temperature sensors 11 based on two different thresholds, for two different functional units (in this case a processor core and a graphics unit). However, embodiments are possible and contemplated (including the embodiment illustrated in FIG.1)in which temperatures reported by more than two temperature sensors 11 are monitored for more than two functional units. Additionally, while comparisons are made against two different thresholds in this example, comparisons against more than two thresholds are also possible and contemplated for various embodiments. Embodiments configured to monitor only a single temperature sensor 11, against only a single temperature threshold, and/or for controlling only a single functional unit are also possible and contemplated.

In the embodiment shown, trip point circuit 13 includes four separate comparators 21A-21D. Each of the comparators is coupled to receive temperature readings from one of the temperature sensors 11A or 11B. Trip point circuit 13 also includes threshold registers 22 and 23, which are configured to store first and second temperature threshold values, respectively. In the embodiment shown, the temperature threshold values are programmable. In lieu of registers, other storage devices that may store temperature thresholds may be implemented in other embodiments.

Comparators 21A and 21C are coupled to threshold register 22 in the embodiment shown, while comparators 21B and 21D are coupled to threshold register 23. Comparators 21A and 21B are coupled to receive a temperature readings from temperatures sensor 11A, while comparators 21C and 21D are coupled to receive temperature readings from temperature sensor 11B. Comparators 21A and 21C in the embodiment shown are configure to compare temperature readings to the temperature threshold value stored in threshold register 22. Similarly, comparators 21B and 21D in the embodiment shown are configure to compare temperature readings to the temperature threshold value stored in threshold register 23.

OR gate 27A in the embodiment shown is coupled to receive comparison results from comparators 21B and 21D. If a comparison result from either of comparators 21B or 21D indicates that a correspondingly received temperature reading is above the temperature threshold stored in threshold register 23, OR gate 27A may output a logic 1. Otherwise, if neither of comparators 21B or 21D indicates that respectively received temperature readings exceed the temperature threshold stored in threshold register 23, OR gate 27A may output a logic 0. OR gate 27B in the embodiment shown is coupled to receive comparison results from comparators 21A and 21C. If either of comparators 21A or 21C indicate that a received temperature reading exceeds the temperature threshold stored in threshold register 22, OR gate 27B may output a logic 1. If neither of comparators 21A or 21C indicate that a received temperature reading exceeds the temperature threshold stored in threshold register 22, then OR gate 27B may output a logic 0.

Counter/selector 24A in the embodiment shown is coupled to the output of OR gate 27A. Similarly, counter/selector 24B is coupled to the output of OR gate 27B. Each of the counter/selectors in the embodiment shown may initiate a count responsive to a transition of the output of its respectively coupled OR gate. Additionally, each counter/selector may also generate selection codes used to set a performance level for a given functional unit. Although not explicitly shown in FIG. 2, each counter/selector may also be coupled to receive information from each of comparisons 21A-21D in order to determine which of the temperature sensors 11A and/or 11B are reporting temperatures that are exceeding one of the temperature threshold values. This may in turn allow thermal control circuit 15 to control the respective performance levels of the correspondingly coupled functional units independently from one another.

In the embodiment shown, counter/selector unit 24A is configured to operate based on comparisons of received temperature readings to the temperature threshold stored in threshold register 23. Responsive to a change of state of the output of OR gate 27A (e.g., due to one or both comparators indicating a temperature reading exceeding the threshold stored in threshold register 23), counter/selector 24A may initiate a count. The count may continue until either a predefined count value is reached or until the output of OR gate 27A changes states again, whichever occurs first. The predefined count value may correspond to a predetermined time.

Thus, if the predefined count is reached, counter/selector 24A may change an output code in order to cause a change to a performance level of one or more functional units. If the predefined count is not reached before the output of OR gate 27A changes state again, then counter/selector 24A may maintain its current output code(s), thereby enabling the functional units of IC 10 to maintain their present performance levels. Counter/selector 24B may operate in a similar manner with respect to OR gate 27B. Changing performance levels may include reducing a performance level (e.g., by reducing the frequency of a respectively received clock signal) or increasing a performance level (e.g., by increasing the frequency of a respectively received clock signal). Performance level reductions may occur responsive to determining that a temperature reading is exceeding one of the threshold values. Performance level increases may occur responsive to determining that a temperature reading has fallen below a previously exceeded temperature threshold value.

The output codes provided by counter/selectors 24A and 24B may be received at select inputs by multiplexers 31A and 31B. In one embodiment, multiplexers 31A and 31B may be independently controlled. In other embodiments, multiplexers 31A and 31B may operate in concert with one another. Each of multiplexers 31A and 31B is coupled to receive divisor values as inputs. The divisor value selected by multiplexer 31A may be received by clock divider 32A, while the divisor selected by multiplexer 31B may be received by clock divider 32B. Each of multiplexers 31A and 31B in the embodiment shown is coupled to receive three divisor inputs: full frequency (i.e. divide by 1), divisor 1, and divisor 2. The latter two divisor may cause a receiving one of dividers 32A and 32B to divide its respectively received input clock signal to produce an output clock signal having a lower frequency. For example, if divisor 1=2, then when received by divider 32A, the Clk 1 output signal will have a frequency that is one half that of the input clock signal, CPU Clk 1.

Thus, thermal control circuit 15 in this particular example may control the performance level of a processor core and a graphics unit by controlling the frequencies of clock signals provided thereto. Switching from the full frequency to divisor 1 may reduce the frequency of a divided one of the clock signals by a first amount. Switching to divisor 2 may reduce the frequency of the divided clock signal by a second amount. By changing the divisors received by dividers 32A and 32B, the clock frequencies and corresponding performance levels of the functional units of IC 10 may be controlled in accordance with received temperature readings. Although performance levels are controlled via clock frequencies in the embodiment shown, it is noted that embodiments that control performance levels using different methods are possible and contemplated. For example, supply voltages, workloads, bandwidths, and other parameters may be altered to control performance in various embodiments. Furthermore, embodiments in which multiple parameters are adjustable to control performance in accordance with received temperature readings are possible and contemplated.

FIGS. 3A and 3B are timing diagram illustrating hysteresis in the operation of one embodiment of a hardware-based thermal control apparatus. It is noted that these examples are given for only a single threshold and two performance levels, although as noted above, embodiments are possible and contemplated for multiple thresholds with multiple performance levels.

FIG. 3A illustrates the hysteresis in changing performance levels responsive to temperature readings crossing a temperature threshold. The example shown in FIG. 3A begins with a received temperature being below a threshold value. At (A), it is determined that the temperature level has exceeded the threshold. For a time T1 thereafter, performance is maintained at its current level. When T1 has elapsed (e.g., as indicated by a counter/selector such as that discussed above in reference to FIG. 2), the temperature remains above the threshold, and the performance of a functional unit is dropped from its normal level to a reduced level.

At (B), the temperature has again fallen below the threshold level. For a time T2 thereafter, the performance level of the functional unit is held at a reduced level. When T2 has elapsed, the temperature remains below the threshold, and thus the performance level of the functional unit is restored to its normal level. It is noted that in this particular embodiment, times T1 and T2 are different. However, embodiments where these values are the same are also possible. Furthermore, these values may be programmable in some embodiments.

In FIG. 3B, the temperature again begins at a level that is below the threshold. At (C), the temperature is determined to be above the threshold. A counter may then begin counting to toll the time. However, in this case, the temperature falls back below the threshold before time T1 has elapsed. Since the threshold is no longer exceeded after T1 has elapsed, the performance level is thus maintained.

By using hysteresis in the hardware-based thermal control mechanism, a balance between thermal control and performance may be achieved. More particularly, adding hysteresis to the operation of the hardware-based thermal control mechanism may be useful in preventing performance level changes for short-lived temperature changes that exceed or fall below a threshold, while allowing sufficient time to determine if a change of performance level is desirable.

Figure 4:
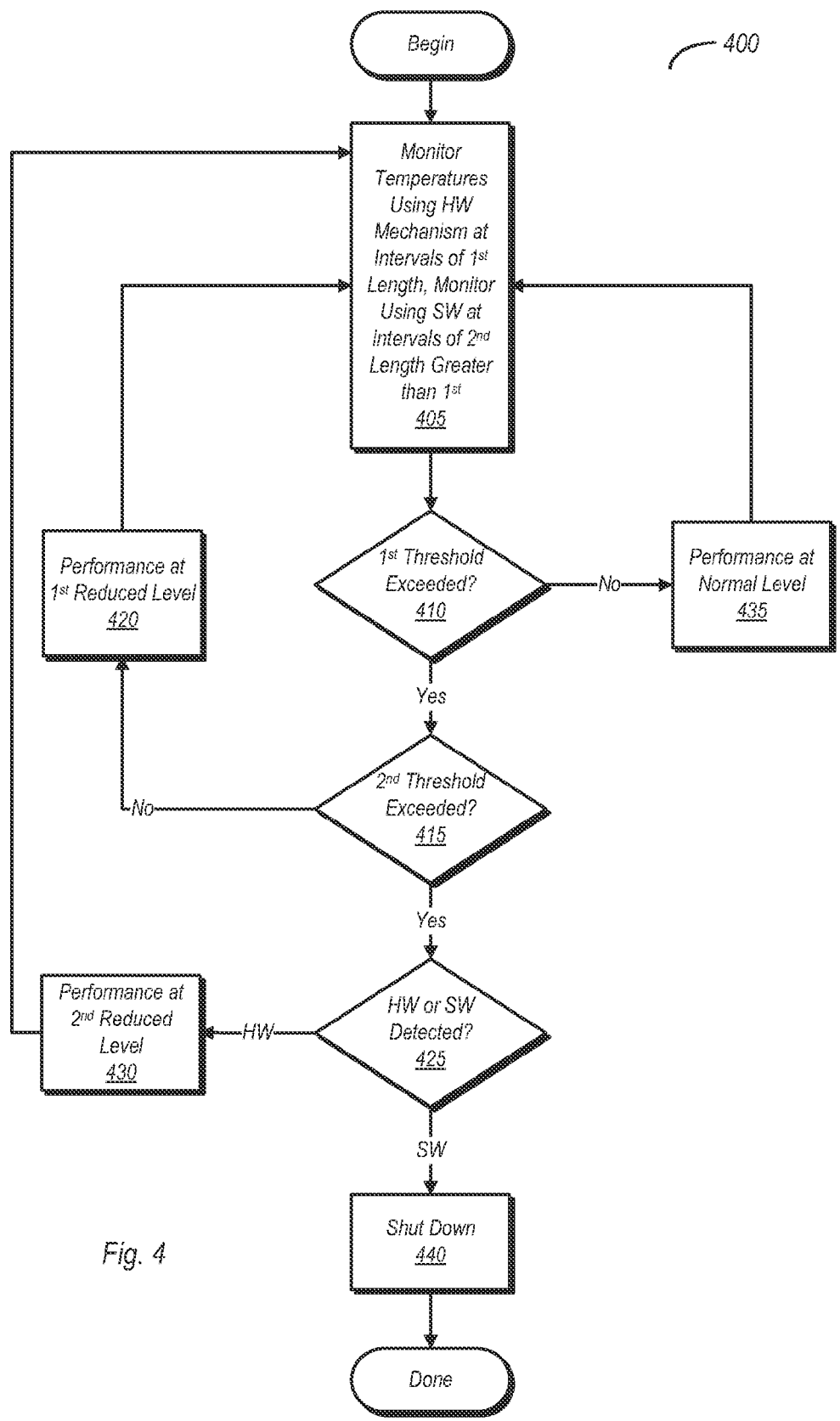
FIG. 4 is a flow diagram illustrating the combined operation of one embodiment of a hardware-based thermal control mechanism in conjunction with one embodiment of a software-based thermal control mechanism.

FIG. 4 is a flow diagram illustrating the combined operation of one embodiment of a hardware-based thermal control mechanism in conjunction with one embodiment of a software-based thermal control mechanism. Method 400 in the embodiment shown may be performed using various combinations of hardware and software embodiments discussed above, or may be implemented using other embodiments not explicitly discussed herein. The method described herein is directed toward a single temperature sensor. However, as noted above, the method may be performed concurrently for any number of sensors with both the hardware and software-based thermal control mechanisms.

Method 400 begins with the monitoring of temperature reading received from a temperature sensor on an IC or within a system (block 405). The monitoring may be performed concurrently by both a hardware-based thermal control mechanism and a software-based thermal control mechanism. The hardware-based thermal control mechanism may monitor temperatures at intervals of a first length, while the software-based thermal control mechanism may monitor temperatures at intervals of a second length. The hardware-based thermal control mechanism may monitor temperature readings more frequently than the software-based thermal control mechanism.

During the monitoring of the temperature readings from the temperature sensors, comparisons of the temperature reading to a $1^{st}$ temperature threshold may be performed. If the temperature reading does not exceed the $1^{st}$ threshold (block 435, no), then operation of a corresponding functional unit or other controlled subsystem may be maintained at a normal (e.g., full) performance level. If the temperature reading exceeds the $1^{st}$ temperature threshold (block 410, yes) but does not exceed a $2^{nd}$ temperature threshold (block 415, no), then the performance of the functional unit may be set to a $1^{st}$ reduced level (block 420). In one embodiment, operating a $1^{st}$ reduced level may include reducing a frequency of a clock signal relative to that of the full frequency during the normal operation mode. Other methods of reducing the performance of a functional unit are also possible and contemplated, including those which change two or more operating parameters.

As noted above, monitoring of temperature readings may be performed by both the hardware and software-based thermal control mechanisms. In this embodiment, the software-based thermal control mechanism may ignore comparisons of temperature readings to the $1^{st}$ threshold, focusing instead on comparisons of the temperature readings to the $2^{nd}$ threshold. The $2^{nd}$ threshold in this embodiment is greater than the $1^{st}$ threshold. Thus, if a comparison determines that a temperature reading is greater than the $2^{nd}$ threshold (block 415, yes), the subsequent actions performed depend on whether the comparison information is utilized by the hardware-based thermal control mechanism or the software-based thermal control mechanism. When the hardware-based thermal control mechanism determines that a temperature reading exceeds the $2^{nd}$ threshold (block 425, HW), the performance of the functional unit may be set to a $2^{nd}$ reduced level.

If the software-based thermal control mechanism determines that the temperature reading exceeds the $2^{nd}$ threshold (block 425, SW), then at least the functional unit (if not the IC/system itself) may be shut down (block 440). Since the hardware-based thermal control mechanism monitors temperature readings relative to the temperature thresholds more frequently than the software-based thermal control mechanism, a determination of a reading exceeding the $2^{nd}$ threshold by the latter may indicate that the hardware mechanism is unable to bring the temperature of the functional unit (or IC/system as a whole) under control. Accordingly, the shutdown may be performed to prevent the possibility of damage to the system. Furthermore, since the hardware-based mechanism monitors temperature readings relative to the temperature thresholds more frequently than the software-based thermal control mechanism, the likelihood that a temperature reading exceeding the $2^{nd}$ threshold is reduced, as is the likelihood that such a result will be detected by the software-based mechanism.

When operating at one of the reduced performance levels, the hardware based mechanism may continue monitoring temperature readings relative to the thresholds per block 405. When operating at the $2^{nd}$ reduced performance level, temperature readings detected below the $2^{nd}$ threshold may eventually result in the hardware-based mechanism increasing the performance level back to the $1^{st}$ reduced performance level. If subsequent temperature readings indicate that the temperature has fallen below the $1^{st}$ threshold, the hardware-based mechanism may further increase the performance level back to the normal performance level. In both reducing and increasing the performance levels, hysteresis may be employed such that performance levels are not reduced or increased due to brief temperature changes that are not otherwise part of a trend of increasing or decreasing temperature. This in turn may allow for more long-term optimization of the performance level based on the overall trend of temperature changes.

Figure 5:
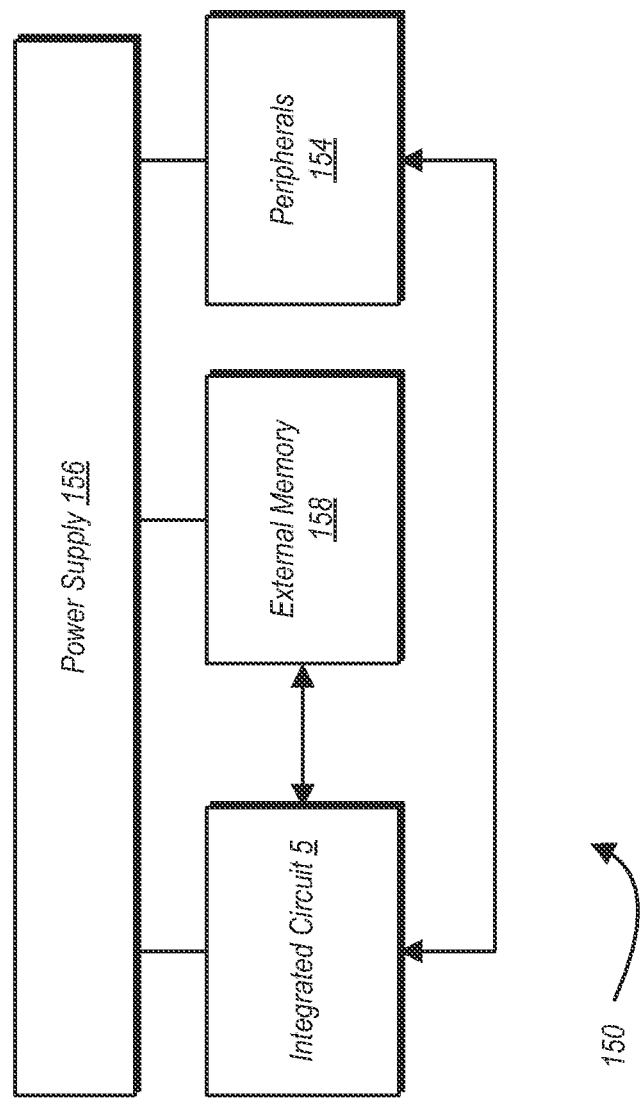
FIG. 5 is a block diagram of one embodiment of a system.

Turning next to FIG. 5, a block diagram of one embodiment of a system 150 is shown. In the illustrated embodiment, the system 150 includes at least one instance of an IC 5 (e.g., that implements processor 10 of FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
one or more thermal sensors;
thermal trip point circuitry coupled to the one or more thermal sensors and configured to detect that one or more thermal thresholds have been exceeded by respective outputs of the one or more thermal sensors; and
thermal control circuitry configured to respond to the thermal trip point circuitry indicating that one or more thermal thresholds have been exceeded by tracking an amount of time that the one or more temperature thresholds have been exceeded and further configured to perform an initial reduction of a performance level of one or more controlled subsystems in the apparatus responsive to an initial indication that the one or more temperature thresholds have been exceeded for at least a predetermined amount of time, and further configured to inhibit performance of the initial reduction of the performance level if the one or more temperature thresholds is exceeded for less than the predetermined amount of time;
wherein the thermal control circuitry is configured to cause a subsequent reduction of the performance level responsive to thermal trip point circuitry indicating that one or more of the temperature thresholds has been exceeded for first duration and further configured to increase the performance level subsequent to the thermal trip point circuitry indicating that temperature readings from the first and second temperature sensors have been below each of the one or more temperature thresholds for a second duration.

2. The apparatus as recited in claim 1, wherein the thermal control circuitry is configured to perform the initial reduction of the performance of the one or more controlled subsystems in the apparatus by reducing a frequency of a clock signal provided to the one or more controlled subsystems.

3. The apparatus as recited in claim 1, wherein the thermal control circuitry is configured to perform the initial first reduction of the performance of the one or more controlled subsystems in the apparatus by reducing a supply voltage provided to the one or more controlled subsystems.

4. The apparatus as recited in claim 1, wherein the thermal control circuitry is configured to respond to the thermal trip point circuitry indicating that one or more thermal thresholds have been exceeded at a predetermined time subsequent to the thermal trip point circuitry indicating that one or more thermal thresholds have been exceeded.

5. The apparatus as recited in claim 1, wherein the thermal control circuitry is configured to discontinue performance reduction of the one or more controlled subsystems at a predetermined time subsequent to the thermal trip point circuitry indicating that one or more of the thermal thresholds are no longer exceeded by the output of the one or more thermal sensors.

6. A method comprising:
  determining, using thermal trip point circuitry, if one or more thermal thresholds have been exceeded by respective outputs received by one or more thermal sensors;
  determining if the one or more temperature thresholds have been exceeded for at least a predetermined amount of time;
  performing an initial reduction of a performance level of one or more controlled subsystems of an integrated circuit responsive to the thermal trip point circuitry providing an initial indication that one or more corresponding thermal thresholds have been exceeded for at least the predetermined amount of time, wherein said reducing is performed by thermal control circuitry; and
  continuing operation at a current performance level for the one or more controlled subsystem if the one or more corresponding thresholds are exceeded for less than the predetermined amount of time;
  performing a subsequent reduction of the performance level responsive to determining that one or more of the temperature thresholds has been exceeded for first duration; and
  performing a subsequent increase in the performance level responsive to determining that temperature readings from the first and second temperature sensors have been below each of the one or more temperature thresholds for a second duration.

7. The method as recited in claim 6, wherein performing the initial reduction of the performance level comprises the thermal control circuitry reducing a frequency of a clock signal provided to at least one of the one or more controlled subsystems.

8. The method as recited in claim 6, further comprising the thermal control circuitry performing a second reduction of the performance level of at least one of the controlled subsystems responsive to determining that the one or more thermal thresholds have been exceeded for at least a first predetermined time.

9. The method as recited in claim 8, further comprising, subsequent to a reduction in the performance level of the at least one of the controlled subsystems, increasing the performance of the at least one of the controlled subsystems responsive to determining that outputs from at least one of the thermal sensors is below at least one of the thermal thresholds for at least a second predetermined time.

10. The method as recited in claim 6, further comprising:
  processing circuitry executing instructions of a software thermal control program configured to monitor if the one or more thermal thresholds have been exceeded by respective outputs received one or more thermal sensors, wherein intervals in which outputs from the one or more thermal sensors are monitored by the software thermal control program are less frequent than intervals in which the thermal trip point circuitry monitors outputs from the one or more thermal sensors; and
  shutting down at least one of the controlled subsystems responsive to the software thermal control program determining that one of the one or more thermal thresholds have been exceeded.

11. An integrated circuit comprising:
  first and second temperature sensors associated with first and second functional units of the integrated circuit, respectively;
  comparison circuitry configured to determine if a temperature reading from at least one of the first and second temperature sensors exceeds a first threshold; and
  a comparator circuit configured to determine if temperature readings received from any of the temperature sensors exceed at least one of one or more temperature thresholds including a first temperature threshold and a second temperature threshold; and
  a control circuit configured to cause an initial reduction of a clock frequency provided to one of the plurality of functional units responsive to the comparator initially determining that a corresponding temperature reading exceeds at least one of the temperature thresholds for at least a predetermined amount of time, wherein the control circuit is further configured to inhibit reducing the clock frequency provided to the one of the plurality of functional units if the temperature reading falls below a first temperature threshold prior to elapsing of the predetermined amount of time;
  wherein the at least one processor core is configured to execute instructions of a temperature control routine, wherein the temperature control routine includes instructions that, when executed by the at least one processor core, monitor temperature readings from the plurality of temperature sensors and shut down at least one of the plurality of functional units responsive to determining that a monitored temperature reading exceeds a second temperature threshold; and
  wherein the thermal control circuitry is configured to cause a second reduction of the frequency of the clock signal responsive to the comparison circuitry determining that the first threshold has been exceeded for a first duration and further configured to increase the frequency of the clock signal subsequent to the comparison circuitry determining that temperature readings from the first and second temperature sensors have been below the first threshold for a second duration.

12. The integrated circuit as recited in claim 11, wherein the integrated circuit further includes a processor configured to execute instructions of a software-based temperature control routine, wherein the software-based temperature control routine is configured to acquire respective temperature readings from the first and second temperature sensors at a first frequency, and wherein the comparison circuitry is configured to acquire respective temperature readings from the first and second temperature sensors at a second frequency that is greater than the first frequency.

13. The integrated circuit as recited in claim 11, wherein the thermal control circuitry is configured to reduce cause a second reduction of the frequency of the clock signal responsive to the temperature reading exceeding a second threshold.

14. A method comprising:
executing, on a processor implemented on an integrated circuit, instructions a software temperature control routine, wherein said executing includes acquiring temperature readings from at least one thermal sensor at intervals of a first duration;
a temperature comparison circuit acquiring temperature readings from the at least one thermal sensor at intervals of a second duration, wherein the second duration is less than the first duration;
a temperature control circuit performing an initial reduction of a performance metric of one of one or more functional units of the integrated circuit responsive to an initial acquisition, by the temperature comparison circuit, of a temperature reading exceeding one of one or more temperature thresholds and determining that the temperature reading continues to exceed the one or more temperature thresholds for at least a predetermined time and further configured to inhibit performing the initial reduction of performance if the temperature reading discontinues exceeding any of the one or more temperature threshold prior to the predetermined time elapsing;
the processor executing instructions of the software temperature control routine to shut down at least one of the one or more functional units responsive to acquiring a temperature reading exceeding one of one or more temperature thresholds;
the temperature control circuit performing a subsequent reduction of the performance metric of the one of the one or more functional units responsive to the temperature comparison circuit a first acquisition, subsequent to the initial acquisition, of a temperature reading exceeding one of the one or more temperature thresholds and determining that the temperature reading continues to exceed the one or more temperature thresholds for a first duration; and
the temperature control circuit performing an increase of the performance metric of the one of the one or more functional units responsive to the temperature comparison circuit a second acquisition, subsequent to the first acquisition, of a temperature reading below each of the one or more temperature thresholds and determining that the temperature reading continues to remain below the one or more temperature thresholds for a second duration.

15. The method as recited in claim 14, further comprising:
the processor executing the instructions to shut down at least one of the one or more functional units responsive to the temperature reading exceeding a first temperature threshold;
the temperature control circuit reducing the performance metric of one or more functional units of the integrated circuit responsive to the temperature comparison circuit acquiring a temperature reading exceeding a second temperature threshold, wherein the second temperature threshold is less than the first temperature threshold.

16. The method as recited in claim 15, further comprising the temperature control circuit reducing, by a first amount, a frequency of a clock signal provided to the one or more functional units responsive to the to the temperature comparison circuit acquiring a temperature reading exceeding the second temperature threshold.

17. The method as recited in claim 16, further comprising the temperature control circuit reducing, by a second amount, the frequency of the clock signal responsive to the to the temperature comparison circuit acquiring a temperature reading exceeding the first temperature threshold.

18. The method as recited in claim 14, further comprising:
the temperature control circuit reducing the performance metric of one or more functional units of the integrated circuit responsive to the temperature comparison circuit acquiring temperature readings exceeding one of one or more temperature thresholds for a first predetermined time; and
the temperature control circuit increasing the performance metric of one or more functional units of the integrated circuit responsive to the temperature comparison circuit acquiring temperature readings below the one of one or more temperature thresholds for a second predetermined time.

19. An integrated circuit comprising:
a plurality of functional units including at least one processor core;
a plurality of temperature sensors each associated with a respective one of the plurality of functional units;
a comparator circuit configured to determine if temperature readings received from any of the temperature sensors exceed at least one of one or more temperature thresholds including a first temperature threshold and a second temperature threshold; and
a control circuit configured to cause a first reduction of a clock frequency provided to one of the plurality of functional units responsive to the comparator determining that a corresponding temperature reading has exceeded at least one of the temperature thresholds for at least a predetermined amount of time, wherein the control circuit is further configured to inhibit reducing a clock frequency provided to the one of the plurality of functional units if the temperature falls below the first temperature threshold prior to elapsing of the predetermined amount of time;
wherein the at least one processor core is configured to execute instructions of a temperature control routine, wherein the temperature control routine includes instructions that, when executed by the at least one processor core, monitor temperature readings from the plurality of temperature sensors and shut down at least one of the plurality of functional units responsive to determining that a monitored temperature reading exceeds at least one of the temperature thresholds;
wherein the control circuitry is configured to cause a second reduction of the clock frequency provided to one of the plurality of functional units responsive to the comparator determining that a first subsequent corresponding temperature reading has exceeded at least one of the temperature thresholds for at least a first duration; and
wherein the control circuitry is configured to cause a increase the clock frequency provided to one of the plurality of functional units responsive to the comparator determining that a second subsequent corresponding temperature reading is below each of the temperature thresholds for at least a second duration.

20. The integrated circuit as recited in claim 19, wherein the processor core is configured to execute instructions of the temperature control routine to compare monitored temperature readings to the one or more temperature sensors at a first periodicity, and wherein the comparator circuit is configured to compare temperature readings from the plurality of temperature sensors to the one or more temperature thresholds at a second periodicity that is less than the first periodicity.

21. The integrated circuit as recited in claim 19, wherein the control circuit is configured to reduce the clock frequency by a first amount responsive to determining that at least one temperature reading from the plurality of temperature sensors exceeds the first temperature threshold and further configured to reduce the clock frequency by a second amount responsive to determining that at least one temperature reading from the plurality of temperature sensors exceeds the second temperature threshold, wherein the second temperature threshold is greater than the first temperature threshold.

22. The integrated circuit as recited in claim 21, wherein the temperature control routine includes instructions that, when executed by the processor, shut down at least one of the plurality of functional units responsive to determining that a corresponding temperature reading exceeds the second threshold.

\* \* \* \* \*